United States Patent [19]

Weber et al.

[11] Patent Number: 4,940,495

[45] Date of Patent: Jul. 10, 1990

[54] PHOTOVOLTAIC DEVICE HAVING LIGHT TRANSMITTING ELECTRICALLY CONDUCTIVE STACKED FILMS

[75] Inventors: Michael F. Weber; Nang T. Tran; Frank R. Jeffrey; James R. Gilbert; Frank E. Aspen, all of St. Paul, Minn.

[73] Assignee: Minnesota Mining and Manufacturing Company, Saint Paul, Minn.

[21] Appl. No.: 280,838

[22] Filed: Dec. 7, 1988

[51] Int. Cl.$^5$ .................. H01L 31/06; H01L 23/48
[52] U.S. Cl. ................... 136/256; 136/258; 357/30; 357/71; 204/192.29; 428/622; 428/632; 428/633; 427/162
[58] Field of Search ............... 428/432, 446, 469, 622, 428/632, 633, 913; 136/256, 258 AM; 357/30 J, 30 K, 30 L, 30 Q, 71; 204/192.26-192.29; 427/162-165

[56] References Cited

U.S. PATENT DOCUMENTS

| 4,020,389 | 4/1977 | Dickson | 315/246 |
| 4,337,990 | 7/1982 | Fan et al. | 350/312 |
| 4,663,495 | 5/1987 | Berman | 136/248 |
| 4,697,041 | 9/1987 | Okaniwa | 136/244 |
| 4,710,433 | 12/1987 | Rowe | 428/623 |
| 4,719,152 | 1/1988 | Ohta | 428/432 |

FOREIGN PATENT DOCUMENTS

A676047 11/1984 PCT Int'l Appl. .

OTHER PUBLICATIONS

Kusano et al; J. Vac. Sci. Technol A.; vol. 4, pp. 2907–2910 (1986).
Chopra et al; Transparent Conductors-A Status Review; Thin Solid Films 102, 1–46 (1983).

Primary Examiner—Aaron Weisstuch
Attorney, Agent, or Firm—Kinney & Lange

[57] ABSTRACT

A light transmitting electrically conductive stacked film, useful as a light transmitting electrode, including a first light transmitting electrically conductive layer, having a first optical thickness, a second light transmitting layer, having a second optical thickness different from the optical thickness of the first layer, and an electrically conductive metallic layer interposed between and in initimate contact with the first and second layers.

18 Claims, 3 Drawing Sheets

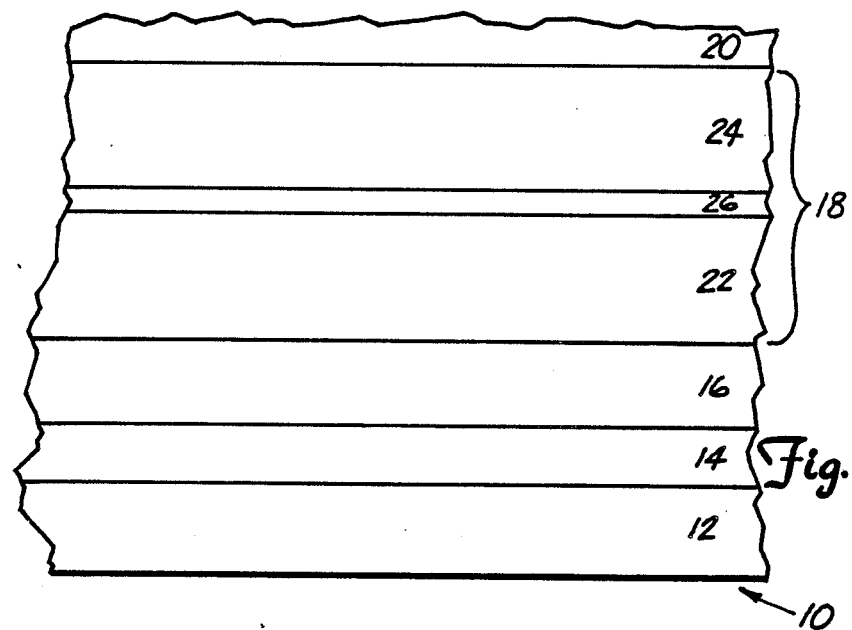
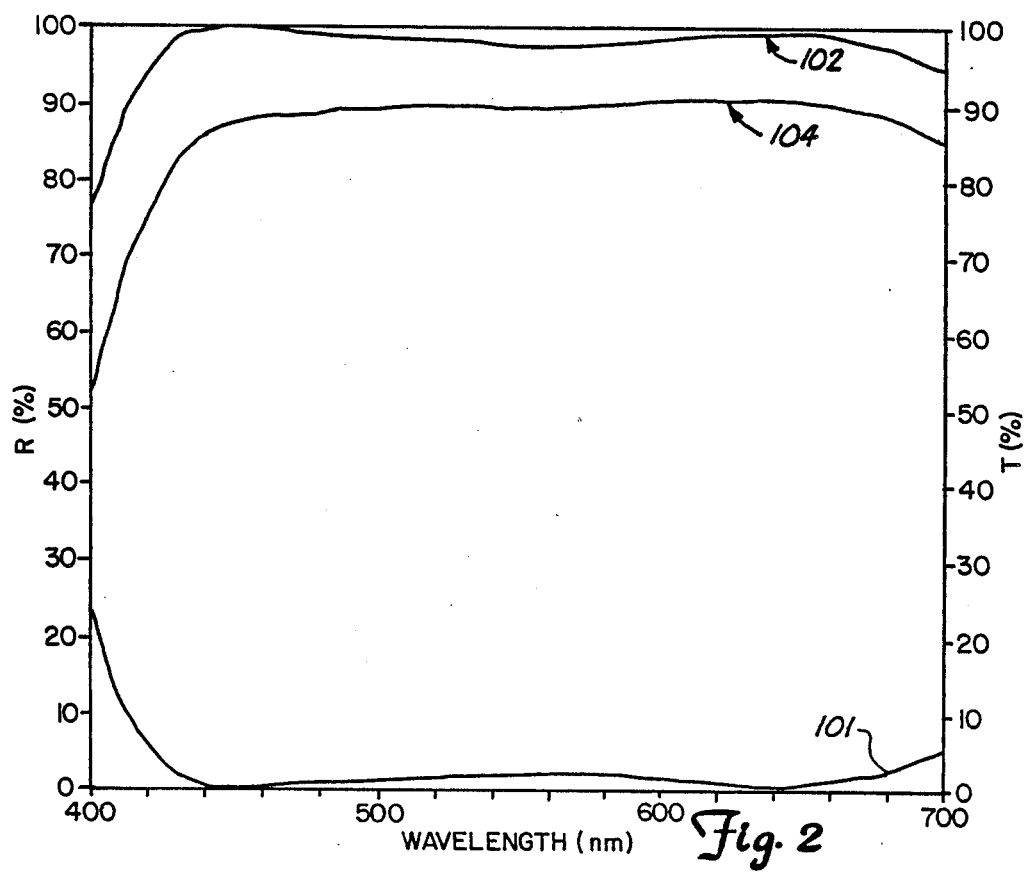

PHOTOVOLTAIC DEVICE HAVING LIGHT TRANSMITTING ELECTRICALLY CONDUCTIVE STACKED FILMS

The government of the United States of America has rights in this invention pursuant to subcontract ZB-4-03056-2 awarded by the United States Department of Energy.

BACKGROUND OF THE INVENTION

The present invention relates to solar cells and in particular to light transmitting, electrically conductive layers in intimate electrical contact with solar cells.

The efficiency of a solar device in converting light incident upon the device into electrical energy is controlled in part by the percentage of light transmitted to the amorphous silicon portion. Light which is reflected or absorbed within the top conductive layer, used for electrical interconnection of the device, is unavailable for conversion into electrical energy by the amorphous silicon portion. Additionally, the efficiency of the device is dependent upon the ability of the transparent conductive layer to conduct electrons either away from or to the amorphous silicon region. Conductivity is particularly important in high output solar devices or large area devices.

Generally, efficient transmission of light and efficient conduction of electricity by the top conductive layer are conflicting goals. For example, thick metallic conductors (i.e. greater than 50 nm) are opaque to light. Very thin films of metal, however, are not opaque. A few metals (notably silver and aluminum) have low light absorption as thin films. However, these same metals are generally highly reflective, even as very thin films, thus resulting in low light transmission.

One approach of the prior art has been the utilization of metal oxides which are both transparent and have a rather modest electrical conductivity. "Transparent," with respect to metal oxides, means that some light is transmitted through the material. The transparent conductive oxides require excessively thick layers or excessively high deposition and/or annealing temperatures to achieve desirable levels of electrical conductance; however, the excessively thick layers of transparent conductive oxides cause the device to suffer from reduced transmission of light because of increased optical absorption.

The combination of transparent conductive oxides and metallic conductors has been suggested. Madan in U.S. patent application Ser. No. 061/676,047 filed Nov. 29, 1984, discloses amorphous silicon semiconductors contacting a thin metallic layer with one overlying antireflection layer approximately 55 to 60 nm thick on top of the metallic layer. The Madan antireflection scheme becomes less efficient when the encapsulant necessary for mechanical and chemical protection of the device is applied over the antireflection layer. Specifically, the reflectance increases by 15 to 25% after a typical encapsulation. The Berman et al. U.S. Pat. No. 4,663,495, discloses transparent electrodes of high reflectance metals and metal oxides laid up in symmetrical stacks. The Okaniwa et al. U.S. Pat. No. 4,697,041, suggests the use of a laminate such as TiO2/Ag/TiO2 as a transparent electrode.

SUMMARY OF THE INVENTION

A light transmitting, electrically conductive stacked film, useful as a light transmitting electrode, includes a first light transmitting, electrically conductive layer, a second light transmitting layer dissimilar in optical thickness from the first layer, and an electrically conductive metallic layer interposed between the first and second light transmitting layers. A photovoltaic device includes the light transmitting, electrically conductive stacked film as a top electrode, a semiconductor layer, and a bottom electrode.

BRIEF DESCRIPTION OF THE DRAWINGS

FIG. 1 is a schematic sectional view of a photovoltaic device of this invention.

FIG. 2 are results for a computer model of optical reflectance and transmission for a dissimilar stacked film of SnO2/Ag/SnO2 on an amorphous silicon solar cell.

DETAILED DESCRIPTION OF THE PREFERRED EMBODIMENTS

Figure 3:
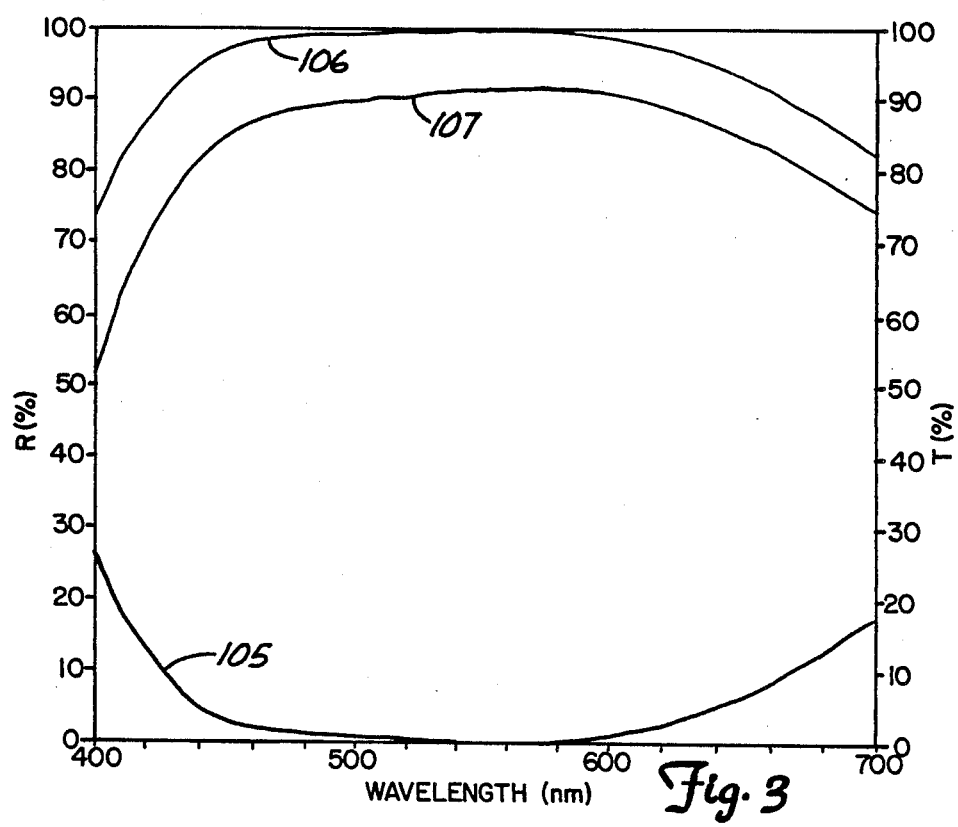
FIG. 3 are results for a computer model of a dissimilar stacked film as in FIG. 4 but including an encapsulant layer.

A solar device of this invention is generally shown at 10 in FIG. 1. The device includes a substrate 12. A first electrical conductive layer 14 is deposited on the substrate 12. A hydrogenated amorphous silicon semi-conductor portion 16 is deposited on the first conductive layer 14. A light transmitting, electrically conductive layer 18 is deposited on the amorphous silicon region 16. An optional encapsulant layer 20 is laminated to the light transmitting conductive film or layer 18. The first conductive layer 14 serves as one of a pair of electrodes for the amorphous silicon region 16, which generates electrical current in a circuit when exposed to light of appropriate wavelengths. The light transmitting conductive layer 18 also serves as an electrode for the amorphous silicon region.

Solar cell energy conversion efficiency is directly proportional to the efficiency of transmitting of light to the amorphous silicon portion 16 through the light transmitting, electrically conductive layer 18. For large area cells, this efficiency is also proportional to the lateral electrical conductivity of the light transmitting electrically conductive layer 18.

The light transmitting conductive film or layer 18 includes a first light transmitting, electrically conductive layer 22 of material, such as a light transmitting conductive oxide, a second light transmitting layer 24 of material, such as transparent oxide, both typically deposited by sputtering, and a metal layer 26 interposed between the first light transmitting conductive layer 22 and the second transparent layer 24. The metal layer 26 is typically deposited by evaporation or sputtering onto the first layer 22, prior to deposition of the second layer 24.

The amorphous silicon region 16, typically, a p-i-n system, includes a p-type conductivity layer adjacent the bottom conductive layer, an intermediate intrinsic layer, and an n-type conductivity layer. An alternative construction of the amorphous silicon region includes an n-type conductivity layer adjacent the bottom conductive layer, an intrinsic layer, and a p-type conductivity upper layer.

The first electrical conductive layer 14, typically is formed of a conductive metal, for example stainless steel, aluminum, or silver. Alternatively, the first electrical conductive layer may be formed as a laminate of metals, such as for example, a laminate of stainless steel and silver or aluminum.

The preparation of the solar device 10 typically entails sputtering of a metal onto a substrate 12, such as a polyimide film, to form the first layer 14. The amorphous silicon hydride layer 16 is deposited by decomposing a mixture of silane ($SiH_4$) and hydrogen ($H_2$) gases and appropriate dopants in a plasma assisted chemical vapor deposition system. An appropriate dopant to form an $n^+$ layer is phosphine ($PH_3$) gas. An appropriate dopant to form a $p^+$ layer is diborane ($B_2H_6$) gas.

The layers of the device 10 are each in intimate contact with the adjacent layer due to the various methods of deposition employed.

When surrounded by air, symmetrical sandwiching or stacking of a thin layer of metal between two dielectrics, such as transparent oxides, is known to increase transmission of light relative to an unsandwiched or exposed thin metal layer. However, symmetrical dielectric stacks are ineffective in reducing reflection when in contact with another dielectric material of a higher index of refraction. Symmetrical stacks are generally ineffective to reduce reflection when employed as a transparent top conductive layers, since doped, hydrogenated amorphous silicon has a refractive index of about 4.0. The present invention employs a stack having light transmitting or dielectric layers of dissimilar optical thicknesses to reduce detrimental reflectance of a stack or sandwich used as a light transmitting top conductive layer.

By "dissimilar optical thickness" is meant that the optical path length differs in each of the layers 22 and 24. Optical thickness is dependent upon physical thickness and refractive index. Thus by employing nonidentical materials or, alternatively, different physical thicknesses or, alternatively, nonidentical materials and different physical thicknesses layers 22 and 24, having dissimilar optical thickness, may be formed. The resulting stack is an improvement over previously known light transmitting electrically conductive electrodes because it reflects less light and transmits more light to the silicon layer. The reduced reflection and increased transmission remain even though a typical encapsulant layer 20 is applied.

Suitable light transmitting electrically conductive materials are generally of high refractive index, for example, from about 1.8 to 2.4 and exhibit at least some electrical conductivity (preferably, $\sigma$ is at least 1 (ohm-cm)$^{-1}$). Indices of refraction stated herein refer to an average value taken at wavelengths near approximately 550 nm, since some oxides have a high optical dispersion, with the index of refraction varying from n=1.8 to n=2.4 for wavelengths from 800 nm to 400 nm, respectively. Typically, the well known transparent conductive oxides are suitable materials. For example, ZnO (optionally doped with a group III element such as Al, In, Ga, or B); $SnO_2$ (doped with F or Sb); ITO ($In_2O_3/S_nO_2$); $CdSnO_4$; $TiO_2$ doped with F, and $SrTiO_2$ are suitable materials for either light transmitting layer. The oxides ZnO, $SnO_2$, and ITO ($In_2O_3/S_nO_2$) are particularly preferred for the first layer, layer 22 because of the ease with which they may be doped. An additional requirement for the first layer of light transmitting material is compatibility with amorphous silicon. However, the second light transmitting layer, not in contact with the amorphous silicon, need not be electrically conductive or compatible with amorphous silicon. By compatible is meant that the electrical current and voltage properties of the semiconductor are not degraded. An example of an incompatible transparent layer is sputter deposited ITO from which, under some conditions, indium can diffuse into the amorphous silicon, and alter its electrical characteristics.

Suitable metals for the metal layer 26 are generally highly reflective metals with a high electrical conductivity. Suitable metals include but are not limited to silver, aluminum, gold and copper. Silver is particularly preferred. In order to achieve low optical absorption in the metal layer 26, the first light transmitting layer, 22, must be deposited as a smooth, fine-grained oxide layer. Smooth, fine-grained oxide layers promote nucleation of silver layers. The resulting silver layers exhibit minimal optical absorption properties.

Computer modeling was employed to better understand the anti-reflection properties of the stacked layer upper electrode of FIG. 1 based on the dissimilar light transmitting films having a layer of silver therebetween, and allow for optimization of the optical path lengths in each. The computer modeling led to the discovery of improved arrangements of dissimilar optical thickness dielectric/silver/dielectric thin film stack electrodes which serve to couple a relatively high percentage of light into amorphous silicon solar cells.

The important parameter in optical design is the optical path length, n.d, which is the index of refraction, n, of the material in which the light travels multiplied by the physical thickness, d, of the material through which the lights travels. By optical thickness is meant the optical path length perpendicular to the face of the layer. Optical thickness, therefore, is the index of refraction of the light transmitting material of the layer, multiplied by the film thickness. In order to facilitate understanding of the invention, the thicknesses, d, stated herein for the light transmitting layers are based upon the use of transparent conducting material with an index of refraction of about 2.0. Of course, for materials having different refractive indices, the preferred thickness will vary such that the product n d. (the optical thickness) remains approximately the same.

The computer model employed herein is based upon the mathematical treatment of stacked thin films as presented in Principles of Optics, by Born and Wolf, Pergamon Press. Results predicted by the model are presented in FIG. 2. The stacked film used in the computer model consisted of a first light transmitting electrically conductive layer 22 having a thickness of 100 nm in contact with amorphous silicon, a 10 nm thick silver layer and a 40 nm thick second light transmitting layer. In FIG. 2, the wavelength of the light incident upon the stacked film is presented on the abscissa in nm. The lower curve 101 shows reflectance. The upper curve 102 shows the amount of light which is not reflected (i.e. 100%−% reflectance). The middle curve 104 shows the transmission of light into a p-i-n amorphous silicon solar cell by the stacked film. The computer model predicts a broad double minimum of the reflectance occurring at wavelengths of approximately 450 nm and at 640 nm.

Computer modeling was also conducted for solar cells encapsulated with a material having an index of refraction of about 1.5, which is representative of either a typical polymer encapsulant or a typical glass encapsulant. The transmission of light through a stacked film covered by an encapsulant of n=1.5 into an amorphous silicon solar cell is shown in FIG. 3. Curve 105, the lower curve, shows reflectance. Curve 106, the upper curve, shows the amount of light not reflected. Curve 107, the middle curve, shows light which would be transmitted into an amorphous silicon cell by the encapsulated stacked film. In the computer model, a correction was not made for front surface reflection from the encapsulant. Further, the curves for both FIGS. 2 and 3 are based upon the impinging light being incident on the surface in a direction perpendicular to that surface. The model assumes an artificially thick amorphous silicon solar cell, in order to simplify and reduce the interference peaks in the far red which occur with amorphous silicon films in typical solar cells. In FIG. 3, note that the local reflection maximum associated with an unencapsulated stack is converted to a local minimum upon encapsulation. This predicts that the cells should change color, from green to blue upon encapsulation, as is observed experimentally. (The human eye is more sensitive to blue wavelengths than to the far red wavelengths.) The present invention is also applicable to an encapsulant within a wide range of indices of refraction. For example, any encapsulant having an index of refraction (n) from about 1.0 (such as air) to about 2.0 is compatible with the present invention.

The high optical transmission for the encapsulated stacked film bears a strong resemblance to the transmission of light through a quarter-wave thick coating of indium-tin oxide (ITO) on amorphous silicon. However, while possessing optical characteristics similar to quarter-wave ITO, the stacked film of this invention significantly reduces the sheet resistance from approximately 100 ohms per square, which is representative of a quarter-wave thickness of ITO, to less than 15 ohms per square. The advantage of the stacked film of this invention is that it allows low sheet resistance metals for example, silver, to be employed in top conductive contacts which retain the high optical transmission characteristics of thin layers of transparent conductive oxides. This advantage is maintained in the presence of a wide range of encapsulants, having refractive indices from about 1.0 to about 2.0.

One feature of the present invention is the first light transmitting layer has a greater thickness than the second light transmitting layer. Preferably, the first transmitting layer having an index of refraction from about 1.8 to 2.4 and being about 90 to about 115 nm thick and having an optical thickness of about 180 to about 230 nm with a preferred optical thickness of about 100 nm, and an electrically conductive metallic layer being about 10 nm thick, and a second light transmitting layer having an index of refraction from about 1.8 to about 2.4 and being about 10 to about 50 nm thick with an optical thickness from approximately 20 nm to approximately 100 nm and preferably about 40 nm. The thickness differential may be alternatively described as a layer of material interposed between a silicon layer and a conventional symmetrical oxide/metal/oxide sandwich. However, no physical boundary is present between the interposed layer and the conventional sandwich. While not wishing to be bound by theory, it is believed that the additional thickness of material has an optical thickness close to one-quarter the wavelength of the incident light (550 nm is typically chosen as the center wavelength of visible light). The extra quarter wavelength optical thickness of oxide serves to produce a 180° phase shift of the electric field reflected from the silicon surface in order to destructively interfere with the electric field reflected from the top surface of the stack. The conventional symmetric stack of 40 nm oxide/10 nm silver/40 nm oxide is essentially a silver layer with an antireflection layer on each side. These antireflection layers are only effective when the remaining exposed sides thereof are in contact with a material having a lower index of refraction. A material having higher index of refraction, such as doped, hydrogenated amorphous silicon, does not produce a 180° phase shift at the interface, thus causing the antireflection effect to fail. The additional quarter wave thickness of the present invention shifts the phase of the light by 180° thus maintaining the desirable antireflection effect. Without the differential quarter wavelength thickness of material present in the first light transmitting, electrically conductive layer of the present invention, approximately 30% of the visible spectrum would be reflected.

The diffential thickness of light transmitting material present in the first layer of this invention varies slightly from an exact quarter wave thickness of incident light. The slight variation is due to the dispersion of optical constants across the visible spectrum and the use of a microcrystalline silicon p+ layer in the p-i-n solar cell model. Thus, the preferred stacked film includes a 100 nm thick layer of ZnO in contact with both the amorphous silicon and the interposed silver layer, and a 40 nm thick layer of ZnO also in contact with the silver layer. For the special case of a silicon carbide p+ layer, the thickness of the 100 nm layer should be reduced to about 90 nm.

EXAMPLE 1

In order to conveniently measure the electrical conductivity of the silver layer of the sandwich, an 8 nm thick layer of silver was sputtered on a 15 nm layer of sputtered ZnO on a glass plate. The layers had a sheet resistance of about 8 ohms/square and an absorption loss of about 10% for light having a wavelength of about 400 nm to about 800 nm. Sheet resistance is determined by measuring the electrical resistance between two opposing edges of any square sheet of a thin film. Electrical contact to each edge is made by a highly conductive metal strip that runs the entire length of the edge. The convenience of using this measurement of resistance is the independence of the unit from the size of the square.

EXAMPLE 2

A stacked film of indium-tin oxide (ITO) having a thickness of 70 nm, a silver layer having a thickness of 8 nm, and a zinc oxide (ZnO) layer having a thickness of 15 nm were sputtered upon a glass substrate by these methods. The resulting stacked film had a sheet resistance less than 10 ohms/square and an absorption loss of less than 10%.

EXAMPLE 3

On a polyimide substrate a preferred embodiment includes a hydrogenated, amorphous silicon n-i-p solar cell semiconductor layer in contact with a zinc oxide (ZnO) layer 22 having a thickness of about 100 nm, a silver (Ag) layer 26 having a thickness of about 10 nm, and a zinc oxide (ZnO) layer 24 having a thickness of about 40 nm. The 10 nm thickness for silver was suggested by experiments which determined that 10 nm of silver has a sheet resistance of approximately 8 ohms per square.

Figure 4:
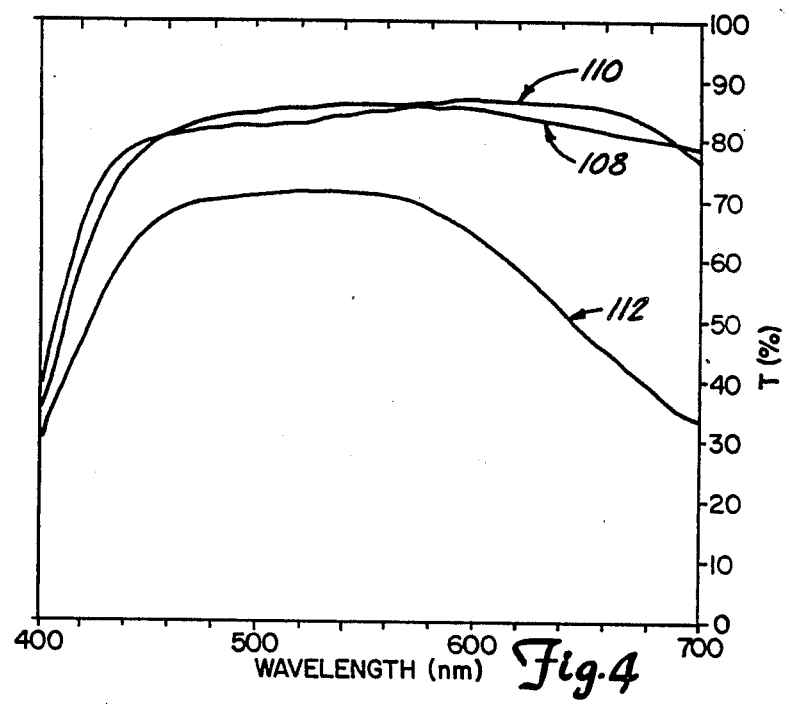
FIG. 4 are results for a computer model of a dissimilar double stacked film.
Figure 5:
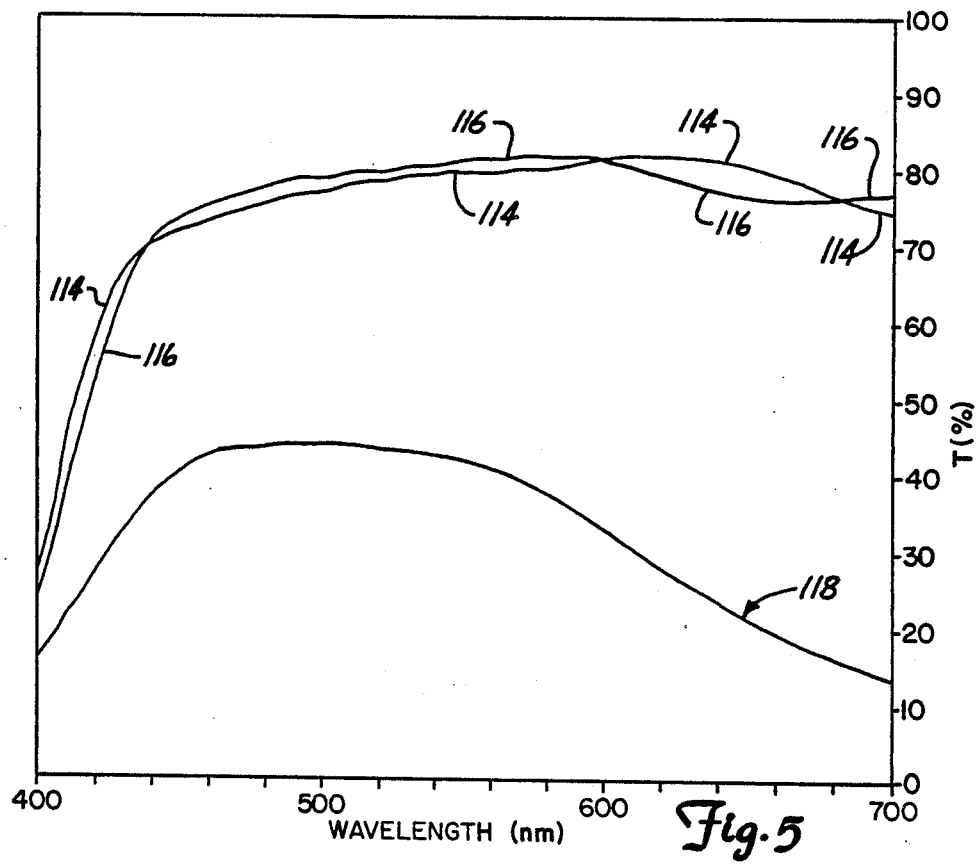
FIG. 5 are results for a computer model of a dissimilar triple stacked film.

In an alternative embodiment, more than one layer of a metal may be employed in an even more efficient top conductive contact. For example, computer model transmission curves of double-stacked and tripled-stacked silver films are shown in FIGS. 4 and 5. The double and triple stacks are compared to the transmission spectra obtained with a single silver layer of equivalent total thickness. The loss of transmission of light for the thicker single stack of silver due to absorption, exceeds the loss in the double and triple stacked layers due to absorption. Multiple silver layers clearly provide higher optical transmission to the silicon solar cell than a single thicker layer of silver.

In FIG. 4, a computer-generated spectra 108 of a dissimilar double-stacked film is presented. The double-stacked film in contact with an amorphous silicon layer may be described as a 100 nm thick layer of tin dioxide, which in turn is in contact with a 10 nm thick layer of silver, topped by an 80 nm thick layer of tin dioxide, which in turn has a 10 nm thick layer of silver, topped by a 40 nm thick layer of tin dioxide. The transmission spectrum of the double-layer stacked film is presented at a function of wavelength shown in nm at the abscissa. Additionally, curve 110 is presented to show the transmission of a dissimilar double-stacked film in combination with an encapsulant having an index of refraction of 1.5. For purposes of comparison, the transmission of a single stack with 20 nm of silver, under an encapsulant, is presented by curve 112. "Dissimilar" in multiple-stacked films means that at least one of the transparent layers is formed of a material which is nonidentical to the material of one of the other transparent layers, or alternatively, that one of the transparent layers is of a different thickness from one of the other transparent layers.

Computer modeling of a dissimilar triple-stacked film is shown in FIG. 5 at 114. In this modeling, amorphous silicon is in contact with a 100 nm thick layer of tin dioxide which in turn is in contact with a 10 nm thick layer of silver, an 80 nm thick layer of tin dioxide, a 10 nm thick layer of silver, and 80 nm thick layer of tin dioxide, a 10 nm thick layer of silver, and finally a 40 nm thick layer of tin dioxide. Results with an encapsulant are also presented at curve 116. The transmission of a single stack with 30 nm of silver is presented for comparison by curve 118. Ultimately, the multiples of stacked films which may be employed are limited primarily by absorption in the silver and oxide films.

Figure 6:
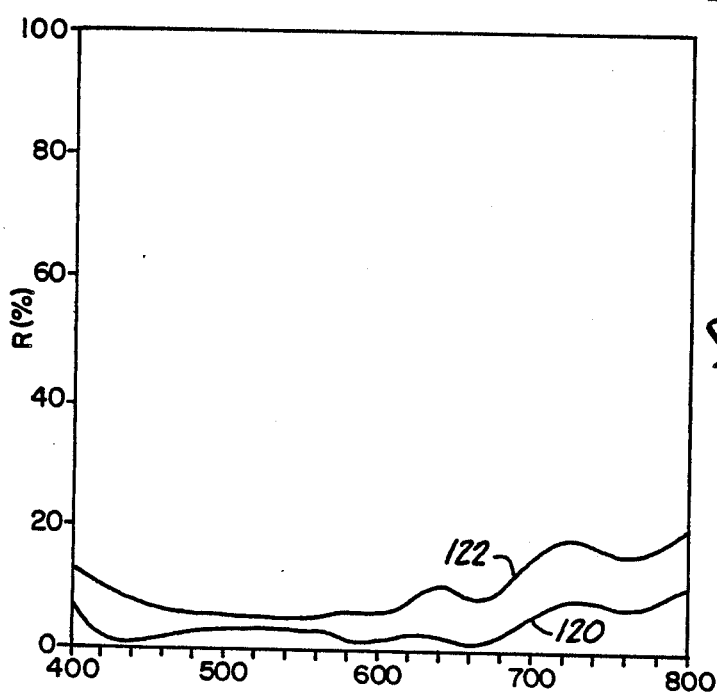
FIG. 6 is a graph of measured reflectance from the dissimilar thin film stacks fabricated so as to correspond to the models of FIG. 1 and FIG. 2.

In order to verify the computer models, reflectance spectra were measured from a stacked film fabricated so as to correspond to the models used in FIG. 2 and 3. The reflectance spectra presented in FIG. 6 confirm the value of the inventive construction predicted by the computer modeling. Curve 120 is measured on an unencapsulated stack and corresponds to Curve 101 of FIG. 2. Curve 122 is measured on an encapsulated stack and corresponds to curve 105 of FIG. 3.

Although the present invention has been described with reference to preferred embodiments, workers skilled in the art will recognize that changes may be made in form and detail without departing from the spirit and scope of the invention. In particular, the present invention is not restricted to silicon solar cells, since the dissimilar stacking arrangement may be employed in contact with any material with a high index of refraction.

What is claimed is:

1. A light transmitting, electrically conductive stacked film deposited on a semiconductor, useful as a light transmitting electrode, comprising:
   a first light transmitting, electrically conductive layer in conductive contact with the semiconductor, having a first optical thickness;
   a second light transmitting layer having a second optical thickness different from the optical thickness of the first layer; and
   an electrically conductive metallic layer interposed between and in intimate contact with the first and second light transmitting layers.

2. The invention of claim 1, wherein the resistivity of the film is less than 15 ohms per square.

3. The invention of claim 1, wherein the absorption loss of incident light is not more than 10%.

4. The invention of claim 1, wherein the metal layer is chosen from the group consisting of: silver, aluminum, gold and copper.

5. The invention of claim 1, wherein the metal is silver.

6. The invention of claim 1, wherein the first and second light transmitting layers each have a refractive index from 1.8 to 2.4.

7. The invention of claim 1, wherein each of the light transmitting layers are formed of metal oxides chosen from the group consisting of:
   ZnO optionally doped with hydrogen, Al, In, Ga, or B;
   $SnO_2$ doped with F or Sb;
   ITO;
   Cd $SnO_4$;
   $TiO_2$ doped with F; and
   $SrTiO_2$.

8. The invention of claim 1 wherein the first light transmitting layer is deposited on amorphous silicon.

9. The invention of claim 1, further comprising an encapsulant in contact with the second light transmitting layer.

10. The invention of claim 9, wherein the encapsulant has a refractive index of approximately 1.5.

11. The invention of claim 1 wherein the first light transmitting layer has an optical thickness of from approximately 180 nm to approximately 230 nm and the second light transmitting layer has an optical thickness of from approximately 20 nm to approximately 100 nm.

12. The invention of claim 1 wherein the first light transmitting layer has an optical thickness of about 100 nm and the second light transmitting layer has an optical thickness of about 40 nm.

13. A photovoltaic device comprising:
   a semiconductor layer having a first side and a second side;
   a first electrode in electrical contact with the second side of the semiconductor layer; and
   a light transmitting top electrode contacting the first side of the semiconductor layer and including a first light transmitting electrically conductive layer in electrical contact with the first side of the semiconductor layer, the first layer having a first optical thickness, and a second light transmitting layer, having a second optical thickness different from the optical thickness of the first layer;

and an electrically conductive metallic layer interposed between and in electrical contact with the first and second layers.

14. The photovoltaic device of claim 13 further comprising an encapsulant layer covering the top electrode wherein the encapsulant layer has an index of refraction of from approximately 1.0 to approximately 2.0.

15. A light transmitting conducting stacked film disposed on an amorphous silicon layer comprising:

a first layer of light transmitting, electrically conducting material being disposed adjacent the amorphous silicon layer and being compatible with amorphous silicon and having an index of refraction from about 1.8 to about 2.4, the first layer being about 90 to about 115 nm thick and having an optical thickness of about 180 to about 230 nm;

a second layer of light transmitting material, different from the material of the first layer, having an index of refraction from about 1.8 to about 2.4, the second layer being about 10 to about 50 nm thick; and an electrically conductive metallic layer interposed between an intimate contact with the first and second light transmitting layers, the metallic layer being about 10 nm thick.

16. The invention of claim 15, wherein the metallic layer is silver.

17. The invention of claim 15, wherein the first and second layers are light transmitting conductive oxides.

18. The invention of claim 15, wherein the first layer is zinc oxide and the second layer is indium tin oxide.

* * * * *

UNITED STATES PATENT AND TRADEMARK OFFICE
CERTIFICATE OF CORRECTION

PATENT NO. : 4,940,495
DATED : July 10, 1990
INVENTOR(S) : Michael F. Weber et al.

It is certified that error appears in the above-identified patent and that said Letters Patent is hereby corrected as shown below:

Col. 10, line 8, after "between", delete "an" insert --and in--.

Signed and Sealed this

Twenty-second Day of October, 1991

Attest:

HARRY F. MANBECK, JR.

*Attesting Officer*  *Commissioner of Patents and Trademarks*